United States Patent

[11] 3,615,629

[72] Inventors Hans Wilhelm
Ludwigshafen (Rhine);
Josef Georg Floss, Ludwigshafen (Rhine);
Herbert Henkler, Darmstadt, all of Germany
[21] Appl. No. 711,185
[22] Filed Mar. 7, 1968
[45] Patented Oct. 26, 1971
[73] Assignee Badische Anilin-& Soda-Fabrik Aktiengesellschaft
Ludwigshafen (Rhine), Germany
[32] Priority Mar. 10, 1967
[33] Germany
[31] P 15 22 444.9

[54] PHOTOSENSITIVE COMPOSITIONS FOR PRODUCTION OF RELIEF-BEARING PLATES, SHEETS OR FILMS
8 Claims, No Drawings

[52] U.S. Cl. .......... 96/115 R, 96/35.1, 96/115 P
[51] Int. Cl. .......... G03c 1/70
[50] Field of Search .......... 96/115, 115 P, 35.1

[56] References Cited

UNITED STATES PATENTS

| | | | |
|---|---|---|---|
| 2,972,540 | 2/1961 | Saner et al. | 96/115 |
| 2,997,391 | 8/1961 | Murray et al. | 96/115 X |
| 3,074,869 | 1/1963 | Workman | 96/115 X |
| 3,081,168 | 3/1963 | Leekley et al. | 96/35.1 |
| 3,203,801 | 8/1965 | Heiart | 96/115 X |
| 3,486,903 | 12/1969 | Henkler et al. | 96/115 |

*Primary Examiner*—Ronald H. Smith
*Attorney*—Johnston, Root, O'Keeffe, Keil, Thompson & Shurtleff

ABSTRACT: Crosslinkable photosensitive sheets, plates or film of soluble highly polymerized substances, compounds having at least two photopolymerizable double bonds, a photoinitiator and N-nitrosohydroxylamine derivatives as polymerization inhibitors.

PHOTOSENSITIVE COMPOSITIONS FOR PRODUCTION OF RELIEF-BEARING PLATES, SHEETS OR FILMS

This invention relates to a process for the production of crosslinkable photosensitive plates, film or sheets of soluble high polymers, compounds having at least two photopolymerizable double bonds, a photoinitiator and a polymerization inhibitor.

Photosensitive plates, film or sheets from which printing plates or fluid control devices can be prepared by exposure to light through a negative or positive and washing out the unexposed areas with a solvent, consist of mixtures of highly polymerized carrier substances, unsaturated monomers containing more than one polymerizable double bond, and photoinitiators. Printing plates prepared in this way are used for example for letterpress and indirect letterpress printing.

Suitable highly polymerized carrier substances includes cellulose derivatives and polyamides. The photoinitiators serve to increase the photosensitivity of the plates, film or sheets. Examples of such photoinitiators are vicinal ketaldonyl compounds, α-ketaldonyl alcohols, acyloin ethers and α-substituted acyloins.

Compounds which contain two or more photopolymerizable double bonds are suitable as monomers for the production of relief-bearing plates. Examples of these are diacrylates or dimethacrylates of dihydric alcohols, e.g. the diacrylates of glycol, propylene glycols, butylene glycols and the glycols of higher alcohols, such as pentanediols and hexanediols as well as diacrylates and polyacrylates of polyfunctional alcohols, for example of glycerol, pentaerythritol and trimethylpropane. Obviously, it is possible to use the diacrylamides, polyacrylamides, dimethacrylamides or polymetharylamides of diamines and polyamines, instead of these diacrylates and polyacrylates. Examples of such amines are ehtylenediamine, propylenediamines and butylenediamines. Corresponding urea derivatives, melamine derivatives or guanidine derivatives which contain two or more acrylic radicals or methacrylic radicals are also suitable. Examples are diacrylourea, dimethacrylourea, methylene-bis-acrylamide and methylene-bis-methacrylamide. Monomers which contain urethane groups may also be used. The derivatives of vinyl esters or vinyl ethers are also suitable.

It is essential that all these compounds contain more than one double bond. Compounds which contain only one polymerizable double bond may however be employed. Care must however be taken to ensure that the degree of cross-linking in the finished polymer is adequately high, i.e. so that washing out of exposed areas from the plates is avoided.

The plates, films or sheets which are to be used for the production of relief images may be prepared for example by dissolving the components, removing the solvent and then pressing, extruding or rolling the mixture. The solutions of the components may however be cast into sheets or film. It is also possible to mix the high polymer in powder form with the monomers followed by processing of the mixture into sheets or plates.

The description of these methods of manufacturing photosensitive plates, sheets and film shows that in every case the mixture of the components is thermally and mechanically stressed. There is therefore a very serious risk of premature polymerization. It is obvious that a material which has already been partly prepolymerized or, in extreme cases, extensively prepolymerized is completely unsuitable for the production of printing plates or other relief-bearing elements. There is a risk of premature polymerization not only during the manufacturing process but also during storage of the plates, sheets or film, because all the monomers used for their production have to be easily polymerizable in order to ensure good photosensitivity of the plates, sheet or film.

A large number of inhibitors has therefore been proposed the addition of which is to prevent both the polymerization of the monomers during production of the photosensitive material and polymerization during storage. These inhibitors should however not impair the photosensitivity of the plates, sheets or film. Inhibitors which have hitherto been proposed include hydroquinone, p-methoxyphenol, p-quinone, copper (I) chloride, methylene blue, naphthylamine, salts of N,N,N'N'-tetraalkyl-3,6diaminophenothiazine and similar substances.

It is generally known however that marked discoloration of the plates, sheets or film is caused by hydroquinone p-quinone and phenols. The components of actinic light which bring about polymerization are filtered out by this discoloration during exposure. The addition of these inhibitors therefore often results in the plates not being completely polymerized during exposure, particularly in the deeper layers. Methylene blue of similar compounds also cause marked discoloring and moreover undergo a change in color depending on the length of exposure. It is also known that methylene blue may act as a sensitizer for long wave light, which makes the handling of plates stabilized in this way extremely difficult. Other stabilizers, for example copper(I) chloride, are not particularly suitable because they are insoluble in the mixture of polyamide and monomers and therefore cannot be distributed therein very easily. α-naphthylamine and its derivatives can be used for a few applications only because of their unpleasant odor and their toxicity. Nitrites (known as excellent stabilizers) have the disadvantage that they cannot be dispersed well in the material to be stabilized.

We have now found that photosensitive plates, sheets or film (hereinafter called plates) of crosslinkable soluble highly polymerized substances, compounds having at least two photopolymerizable double bonds, photoinitiators and polymerization inhibitors can be prepared particularly advantageously by using, as the polymerization inhibitor, a N-nitrosohydroxylamine derivative having the general formula:

$$\left[\begin{array}{c} R-N-O \\ | \\ N=O \end{array}\right]_n X$$

in which *R* denotes an aliphatic, cycloaliphatic, araliphatic or aromatic radical having up to 18 carbon atoms and X denotes a hydrogen atom, a metal or an unsubstituted or substituted ammonium radical and the index *n* is equivalent to the number of positive charges of the radical *X*.

Conventional monomers and polymers as well as conventional photoinitiators may be used for the production of the plates stabilized according to this invention.

Particularly suitable monomers containing at least two polymerizable double bonds are those which, in addition to the double bonds, have amide groups, such as methylene-bis-acrylamide, methylene-bis-methacrylamide, the bis-acrylamides and bis-methacrylamides of ethylenediamine, propylenediamine, butylenediamine, pentamethylenediamine, hexamethylenediamine, heptamethylenediamine, octamethylenediamine, and of polyamines and other diamines which are branched, interrupted by hetero atoms or contain cyclic systems. Monomers which contain urethane groups or urea groups in addition to amide groups, such as the reaction products of diol monoacrylates or diol methacrylates with diisocyanates of the corresponding reaction products of monoacrylamides of diamines with diisocyanates, are also very suitable. Among monomers containing nitrogen 1,3,5-triacrylonyl-hexahydro-1,3,5-triazine or triallyl cyanurate are suitable. Diacrylates, triacrylates, tetraacrylates, dimethacrylates, trimethacrylates or tetramethacrylates of dihydric alcohols or phenols or other polyhydric alcohols or phenols may also be used. The use of bifunctional or polyfunctional polymerizable monomers is however not limited to the choice specified above.

Preferred suitable soluble highly polymerized substances are linear copolyamides which are soluble in conventional solvents or mixtures of solvents, such as lower aliphatic alcohols or mixtures of alcohols and water, ketones, aromatics or mixtures of benzene, alcohols and water, for example copolyamides which have been prepared by a conventional method by polycondensation or activated anionic polymerization of two or more lactams having five to 13 ring members. Examples of such lactams are pyrrolidone, caprolactam, oenantholactam, capryllactam, laurolactam or the equivalent C-substituted lactams, such as C-methyl-epsilon-caprolactam, epsilon-ethyl-epsilon-caprolactam or δethyloenantholactam. The aminocarboxylic acids on which the lactams are based may be polycondensed instead of the lactams themselves. Other suitable copolyamides are polycondensation products of salts of the diamine/dicarboxylic acid type, which have been prepared from at least three polyamide-forming starting substances. Examples of conventional dicarboxylic acids or diamines are adipic acid, suberic acid, sebacic acid, dodecane dicarboxylic acid and the corresponding substitution products, such as α,α-diethyladipic acid, α-ethylsuberic acid, heptadecane dicarboxylic acid-(1,8) or heptadecane carboxylic acid-(1,9), or mixtures thereof and dicarboxylic acids containing aliphatic or aromatic ring systems; diamines, such as pentamethylenediamine, hexamethylene-diamine, heptamethylenediamine, octamethylenediamine or C-substituted and/or N-substituted derivatives of these amines, such as N-methylhexamethylenediamine, N-ethylhexamethylenediamine, 1,6-diamino-3-methylhexane, cycloaliphatic or aromatic diamines, such as metaphenylenediamine, metaxylylenediamine, 4,4′-diaminodiphenylmethane, and the bridging groups between the two carboxylic acid groups and amino groups may be interrupted by heteroatoms. Particularly suitable copolyamides are those which have been prepared by cocondensation of a mixture of one or more lactams and at least one dicarboxylic acid/diamine salt, for example epsilon-caprolactam, hexamethylenediammonium adipate and 4,4′-diamimodicyclohexylmethane adipate.

Examples of particularly suitable photoinitiators are compounds which under the action of light decompose into radicals and start the polymerization, for example vicinal ketaldonyl compounds, such as diacetyl or benzil; ′-ketaldonyl alcohols, such as benzoin; acyloin ethers, such as benzoin methyl ether; ′-substituted aromatic acyloins, such as ′-methylbenzoin. The photoinitiators are used in amounts of from 0.01 to 10 percent by weight, preferably in amounts of 0.01 to 3 percent by weight, with reference to the whole mixture.

The inhibitors may be added during the preparation of the plates by conventional methods. The admixture may be carried out during mechanical mixing of the components or during common dissolution of the components. The inhibitors may however be allowed to diffuse into the plates after they have been prepared. This naturally applies only when the raw materials are not subjected to strong thermal or mechanical stress during the preparation of the plates.

Plates prepared in accordance with this invention should contain at least 0.01 percent and not more than 0.5 percent, preferably 0.05 to 0.3 percent, of inhibitor with reference to the total weight of the photopolymerizable monomers present in the plate material. These limits may of course be disregarded in special cases. Very suitably compounds having the formula:

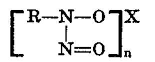

are those in which the substituent *R* denotes a methyl, isopropyl, butyl, benzyl, cyclohexyl or cyclooctyl radical. *R* may however also denote an aromatic radical, for example a phenyl radical or naphthyl radical. The said radicals may also bear substituents, for example halogen, such as chlorine or bromine, methylol groups or cyano groups. Examples of these are the methylolcyclohexyl group and the cyanocyclohexyl group. The substituent *X* may be a metal, for example sodium, potassium, magnesium, calcium, strontium, aluminum, copper, zinc, cerium, iron, nickel, cobalt. Compounds in which *X* denotes ammonium, sodium, potassium or cerium have proved to be particularly suitable. In addition to the said metals, the ammonium radical and substituted ammonium radicals, such as the ammonium radicals bearing alkyl groups or cyclohexyl groups as substituents, are also suitable as substituents.

For example the sodium salt of N-nitrosocyclohexylhydroxylamine, the cerium (III) salt of N-nitrosocyclohexylhydroxylamine or the ammonium salt of N-nitrosocyclohexylhydroxylamine is particularly suitable as an inhibitor.

It is surprising that this specific class of inhibitors should be so outstandingly suitable in the production of photopolymerizable materials. The compounds of the said class combine an extremely effective stabilizing effect during production and storage of the plates with the advantage of not detrimentally affecting the photosensitivity of the plates. As a result, premature polymerization which renders the material useless for the preparation of relief images and which is known in prior art processing methods need no longer be feared, and the material can be stored without its polymerization properties being affected. Moreover, these stabilizers can be extremely easily dispersed in the materials used for the production of the plates. Furthermore, they have little or no color, depending of course on the substituents *R* and *X*, and no unpleasant odor, which is of great importance when handling the material. Since they are only slightly colored or colorless, they absorb (unlike many prior art stabilizers) only a little of the actinic light required for exposure so that this light can act on the material practically without hindrance by the inhibitors.

The invention is illustrated by the following examples in which the parts given are parts by weight.

EXAMPLE 1

One hundred parts of an alcohol-soluble copolyamide (prepared by copolycondensation of adipic acid, hexamethylenediamine, 4,4′-diaminodicyclohexylmethane and epsilon-caprolactam), 15 parts of m-xylylene-bis-acrylamide, 10 parts of triethylene glycol diacrylate, 28 parts of bis-glycol ether of N-methylolacryl-amide, 17 parts of N-methylolmethacrylyl methyl ether, 1 part of benzoin methyl ether and 0.1 part of the cerium (III) salt of N-nitrosocyclohexylhydroxylamine are dissolved in 300 parts of methanol at 60° C. The viscous solution is rolled dry on rollers at a temperature of from 60° to 8° C. The sheet from the rollers is comminuted and pressed into a transparent colorless plate having a thickness of 0.8 mm. in a press at 170° C. and a pressure of 200 kg./sq.cm. The plate is stuck by means of a double coated adhesive film to an aluminum base and exposed in a copying frame (in which a halftone negative is firmly pressed onto the surface of the plate by means of a transparent film, which permits the passage of ultraviolet light when a vacuum is applied) for 8 minutes with a group of 20 fluorescent tubes (type Philips TL–A 40 W/05) mounted closely side by side. The distance between the negative and the fluorescent tubes is 5 cm. The exposed plate is washed out with a 7:2:1 mixture of propanol, ethanol and water in a washout machine consisting of a pump and a number of nozzles through which the solvent is sprayed onto the plate at a pressure of 3 atmospheres. Washout is stopped after 10 minutes, the plates are rinsed with fresh propanol and the adherent solvent is removed with compressed air. A halftone printing plate is obtained which gives excellent printed copies in a letterpress machine.

EXAMPLE 2

A solution of 100 parts of an alcohol-soluble polyamide (see example 1), 20 parts of m-xylylene-bis-acrylamide, 8 parts of triethylene glycol diacrylate, 22 parts of bis-glycol ether of N-methylolacrylamide, 1 part of benzoin methyl ether and 0.1 part of the sodium salt of N-nitrosocyclohexylhydroxylamine in 300 parts of methanol is dry rolled into a sheet free from solvent, comminuted and pressed into a transparent plate, as described in example 1. The plate is stored for 4 weeks and then processed as in example 1. A halftone printing plate is obtained which is outstandingly suitable for letterpress printing.

EXAMPLE 3

A mixture of 40 parts of triethylene glycol diacrylate (to which 0.1 percent of the ammonium salt of N-nitrosocyclohexylhydroxylamine has been added as stabilizer and 0.15 percent of phenanthrenequinone as photoinitiator) and 60 parts of cellulose acetate is homogeneously mixed on rollers at 110° C. This mixture is pressed into a sheet having a thickness of 0.8 mm. at 145° C. as described in example 1. The clear pressed sheet is bonded to a sheet of aluminum 1.0 mm. in thickness. The resultant plate is exposed through a line negative in a copying frame as described in example 1 with a 100 ampere carbon arc lamp arranged at a distance of 165 cm. from the frame. The carbon arc lamp has no reflector. After exposing the plate for 5 minutes, it is washed out with acetone until the aluminum base is laid bare at the unexposed areas. A relief is obtained having shoulders which are perpendicular to the aluminum support and which can be used for the production of fluid control devices.

We claim:

1. A photosensitive composition for the production of relief-bearing plates, sheets or films by cross-linking by exposure to light through a negative or positive and subsequent removal of the unexposed areas with an organic washing solvent or water and organic liquid washing solvent, said composition comprising a highly polymerized polyamide or a cellulose compound which is soluble in said washing solvent, said polyamide or cellulose compound having dispersed therein a. a monomer having at least two photopolymerizable double bonds;

b. from 0.01 to 10 percent by weight, based on the total weight of the composition, of a photoinitiator; and c. 0.01 to 0.5 percent by weight of a N-nitrosohydroxylamine compound having the general formula $$\left[\begin{array}{c} R-N-O \\ | \\ N=O \end{array}\right]_n X$$

wherein *R* denotes an aliphatic, cycloaliphatic, araliphatic or aromatic radical having up to 18 carbon atoms, *x* denotes a hydrogen atom, a metal ion, ammonium or an ammonium radical substituted by alkyl groups or cyclohexyl groups, and *n* denotes a number equivalent to the number of positive charges on the radical *X*.

2. A photosensitive composition as claimed in claim 1 wherein the amount of said N-nitrosohydroxylamine compound is 0.05 to 0.3 percent by weight.

3. A photosensitive composition as claimed in claim 1 wherein the substances a., b., and c. are dispersed in a polyamide having -CONH- as repeating amide units.

4. A photosensitive composition as claimed in claim 1 wherein the substances a., b. and c. are dispersed in cellulose acetate.

5. A photosensitive composition as claimed in claim 1 wherein said N-nitrosohydroxylamine compound is the sodium salt of N-nitrosocyclohexylhydroxylamine.

6. A photosensitive composition as claimed in claim 1 wherein said N-nitrosohydroxylamine compound is the cerium (III) salt of N-nitrosocyclohexylhydroxylamine.

7. A photosensitive composition as claimed in claim 1 wherein said N-nitrosohydroxylamine compound is the ammonium salt of N-nitrosocyclohexylhydroxylamine.

8. A crosslinkable photosensitive plate, sheet or film of photosensitive composition as claimed in claim 1.

PO-1050
(5/69)

UNITED STATES PATENT OFFICE
CERTIFICATE OF CORRECTION

Patent No. 3,615,629 Dated October 26, 1971

Inventor(s) Hans Wilhelm et al

It is certified that error appears in the above-identified patent and that said Letters Patent are hereby corrected as shown below:

Column 1, line 33, "ehtylenediamine" should read -- ethylene-diamine --.

Column 2, line 10, "of" should read -- and --; line 61, "triacrylonyl" should read -- triacryloyl --.

Column 3, line 31, "diamimodicyclohexylmethane" should read -- diaminodicyclohexylmethane --; lines 36 and 38, each occurrence, " '- " should read -- $\alpha$- --.

Signed and sealed this 25th day of April 1972.

(SEAL)
Attest:

EDWARD M.FLETCHER,JR.
Attesting Officer

ROBERT GOTTSCHALK
Commissioner of Patents